(12) United States Patent
Ni et al.

(10) Patent No.: US 10,938,353 B2
(45) Date of Patent: Mar. 2, 2021

(54) COULOMB COUNTER WITH OFFSET CALIBRATION

(71) Applicant: Analog Devices International Unlimited Company, Limerick (IE)

(72) Inventors: Jinhua Ni, Shanghai (CN); Ailing Li, Shanghai (CN)

(73) Assignee: Analog Devices International Unlimited Company, Limerick (IE)

( * ) Notice: Subject to any disclaimer, the term of this patent is extended or adjusted under 35 U.S.C. 154(b) by 63 days.

(21) Appl. No.: 16/364,930

(22) Filed: Mar. 26, 2019

(65) Prior Publication Data

US 2020/0313627 A1     Oct. 1, 2020

(51) Int. Cl.
*H03F 1/02* (2006.01)
*H03F 1/30* (2006.01)

(52) U.S. Cl.
CPC ......... *H03F 1/30* (2013.01); *H03F 2200/129* (2013.01); *H03F 2200/375* (2013.01); *H03F 2200/462* (2013.01)

(58) Field of Classification Search
CPC ............. H03F 3/005; H03F 3/45; H03F 1/303
USPC ..................................... 330/9; 327/124, 307
See application file for complete search history.

(56) References Cited

U.S. PATENT DOCUMENTS

| | | | |
|---|---|---|---|
| 4,356,450 A | 10/1982 | Masuda | |
| 5,789,974 A | 8/1998 | Ferguson, Jr. et al. | |
| 6,194,941 B1 | 2/2001 | Zarabadi et al. | |
| 6,518,838 B1 | 2/2003 | Risbo | |
| 6,762,643 B2 | 7/2004 | Milanesi | |
| 6,967,514 B2 | 11/2005 | Kizer et al. | |
| 9,087,567 B2 | 7/2015 | Yildirim et al. | |
| 9,316,695 B2 | 4/2016 | Takahashi et al. | |
| 9,444,405 B1 | 9/2016 | Dao et al. | |
| 9,503,026 B2 | 11/2016 | Lam et al. | |
| 9,571,043 B1 | 2/2017 | Lum et al. | |
| 9,766,295 B2 | 9/2017 | Kokorin et al. | |

(Continued)

FOREIGN PATENT DOCUMENTS

EP       1343018 A1    9/2003
WO   WO-2011071836 A1    6/2011

OTHER PUBLICATIONS

Mcleod, Scott, et al., "A Digital Offset-Compensation Scheme for an LA and CDR in 65-nm CMOS", IEEE Symposium on VLSI Circuits, Kyoto, Japan, (Jun. 2009), 2 pgs.

(Continued)

*Primary Examiner* — Steven J Mottola
(74) *Attorney, Agent, or Firm* — Schwegman Lundberg & Woessner, P.A.

(57) ABSTRACT

This disclosure describes techniques for compensating for amplifier drift. An amplifier is configured to generate an output that triggers a charge counter to generate a charge count value based on a charge count signal. A current digital-to-analog converter (IDAC) is coupled to the amplifier and configured to provide an offset current to a first input of the amplifier. An offset correction circuit is configured to: determine whether a duty cycle associated with the amplifier exceeds a specified threshold and generate a signal to cause the MAC to adjust the value of the offset current to compensate for amplifier drift based on determining whether the duty cycle exceeds the specified threshold.

20 Claims, 6 Drawing Sheets

(56) References Cited

U.S. PATENT DOCUMENTS

2007/0229115 A1* 10/2007 Hwang .................. H03K 5/065
326/93
2013/0285726 A1* 10/2013 Roytman ............. H03K 5/1565
327/175

OTHER PUBLICATIONS

Mrkovic, B., et al., "Efficient and Reusable Offset Cancellation Method Implemented in CMOS Design", Proc. of the 32nd Intl. Convention MIPRO, Zagreb, Croatia, (2009), 5 pgs.

* cited by examiner

COULOMB COUNTER WITH OFFSET CALIBRATION

FIELD OF THE DISCLOSURE

This document pertains generally, but not by way of limitation, to accurately monitoring the charge of a battery over a very wide dynamic range.

BACKGROUND

Accurate knowledge of the state of a battery's charge can be important in several applications, such as in connection with electric vehicles. Battery voltage is sometimes monitored and equated with a measure of this charge. However, the relationship between battery voltage and the state of charge of a battery can fluctuate as a function of other conditions, such as temperature and battery usage history. Coulomb counters can measure the electrical charge which enters or leaves a battery.

A low resistance may be placed in series between the battery and its load. The voltage across the sense resistance may be measured and equated to the current which enters or leaves the battery. This voltage may be integrated, thus providing a measure of the charge of the battery. The battery current in some applications, such as electric vehicles, may vary from several hundred amps to only a few milliamps. The dynamic range of coulomb counters, however, may not be sufficient to accurately measure these currents over such a wide dynamic range. For high currents, the dynamic range may be limited by the maximum voltage drop across the sense resistor and/or by its power dissipation capability. For small currents, the dynamic range may be limited by an offset from the voltage measuring circuit and/or by parasitic thermocouples in a connection to the sense resistor.

SUMMARY OF THE DISCLOSURE

In some certain embodiments, a system and method are provided for compensating for amplifier drift. An amplifier is configured to generate an output that triggers a charge counter to generate a charge count value based on a charge count signal. A current digital-to-analog converter (IDAC) is coupled to the amplifier and configured to provide an offset current to a first input of the amplifier. An offset correction circuit is configured to: determine whether a duty cycle associated with the amplifier exceeds a specified threshold and generate a signal to cause the MAC to adjust the value of the offset current to compensate for amplifier drift based on determining whether the duty cycle exceeds the specified threshold.

In some implementations, the charge counter comprises a coulomb counter, and wherein the charge count signal generates a switch signal that swaps the first input of the amplifier with a second input of the amplifier when a voltage at the output of the amplifier exceeds a reference voltage value. The offset correction circuit is configured to determine whether the duty cycle associated with the amplifier exceeds the specified threshold by: counting a first number of periods of a given waveform during a first portion of a period of the switch signal; counting a second number of periods of the given waveform during a second portion of the period of the switch signal adjacent to the first portion; and determining whether the duty cycle associated with the amplifier exceeds the specified threshold based on a difference between the first and second numbers.

In some implementations, the offset correction circuit is configured to determine that the duty cycle associated with the amplifier corresponds to the specified threshold when the first and second numbers are equal indicating the switch signal has a fifty percent duty cycle. The first portion of the period of the switch signal is measured from a rising edge of the switch signal to an adjacent falling edge of the switch signal, and the second portion of the period of the switch signal is measured from the falling edge of the switch signal to an adjacent rising edge of the switch signal. In some implementations, when the first number is greater than the second number, the duty cycle is determined to be greater than the specified threshold, and when the first number is less than the second number, the duty cycle is determined to be less than the specified threshold.

In some implementations, the offset correction circuit is configured to generate the signal by: incrementing a count value that is provided as the signal when the duty cycle is determined to be greater than the specified threshold; and decrementing the count value when the duty cycle is determined to be less than the specified threshold.

In some implementations, the offset correction circuit is configured to count the first number of periods by: resetting a duty cycle counter at a beginning of the first portion; and incrementing the duty cycle counter at an end of each period of the waveform during the first portion. The offset correction circuit is configured to count the second number of periods by decrementing the duty cycle counter at an end of each period of the waveform during the second portion. In some implementations, the waveform is a saw-tooth waveform.

In some implementations, the offset correction circuit is configured to determine whether the duty cycle associated with the amplifier exceeds the specified threshold at each period of the switch signal. The offset current compensates for amplifier drift results from temperature drift or supply drift.

In some embodiments, a method is provided for compensating for amplifier drift. The method includes generating, using an amplifier, an output that triggers a charge counter to generate a charge count value based on a charge count signal; applying an offset current to a first input of the amplifier; determining whether a duty cycle associated with the amplifier exceeds a specified threshold; and generating a signal to adjust the value of the offset current to compensate for amplifier drift based on determining whether the duty cycle exceeds the specified threshold.

In some implementations, the charge counter comprises a coulomb counter, and wherein the charge count signal generates a switch signal that swaps the first input of the amplifier with a second input of the amplifier when a voltage at the output of the amplifier current exceeds a reference voltage value.

In some implementations, the method includes counting a first number of periods of a given waveform during a first portion of a period of the switch signal; counting a second number of periods of the given waveform during a second portion of the period of the switch signal adjacent to the first portion; and determining whether the duty cycle associated with the amplifier exceeds the specified threshold based on a difference between the first and second numbers.

In some implementations, the first portion of the period of the switch signal is measured from a rising edge of the switch signal to an adjacent falling edge of the switch signal, and wherein the second portion of the period of the switch signal is measured from the falling edge of the switch signal to an adjacent rising edge of the switch signal. In some implementations, when the first number is greater than the second number, the duty cycle is determined to be greater than the specified threshold, and when the first number is less than the second number, the duty cycle is determined to be less than the specified threshold.

In some embodiments, an apparatus is provided for compensating for amplifier drift. The apparatus includes: means for generating, using an amplifier, an output that triggers a charge counter to generate a charge count value based on a charge count signal; means for applying an offset current to a first input of the amplifier; means for determining whether a duty cycle associated with the amplifier exceeds a specified threshold; and means for generating a signal to adjust the value of the offset current to compensate for amplifier drift based on determining whether the duty cycle exceeds the specified threshold.

In some implementations, the charge counter comprises a coulomb counter, and wherein the charge count signal generates a switch signal that swaps the first input of the amplifier with a second input of the amplifier when a voltage at the output of the amplifier current exceeds a reference voltage value.

In some implementations, the apparatus includes: means for counting a first number of periods of a given waveform during a first portion of a period of the switch signal; means for counting a second number of periods of the given waveform during a second portion of the period of the switch signal adjacent to the first portion; and means for determining whether the duty cycle associated with the amplifier exceeds the specified threshold based on a difference between the first and second numbers.

This overview is intended to provide an overview of subject matter of the present patent application. It is not intended to provide an exclusive or exhaustive explanation of the inventive subject matter. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
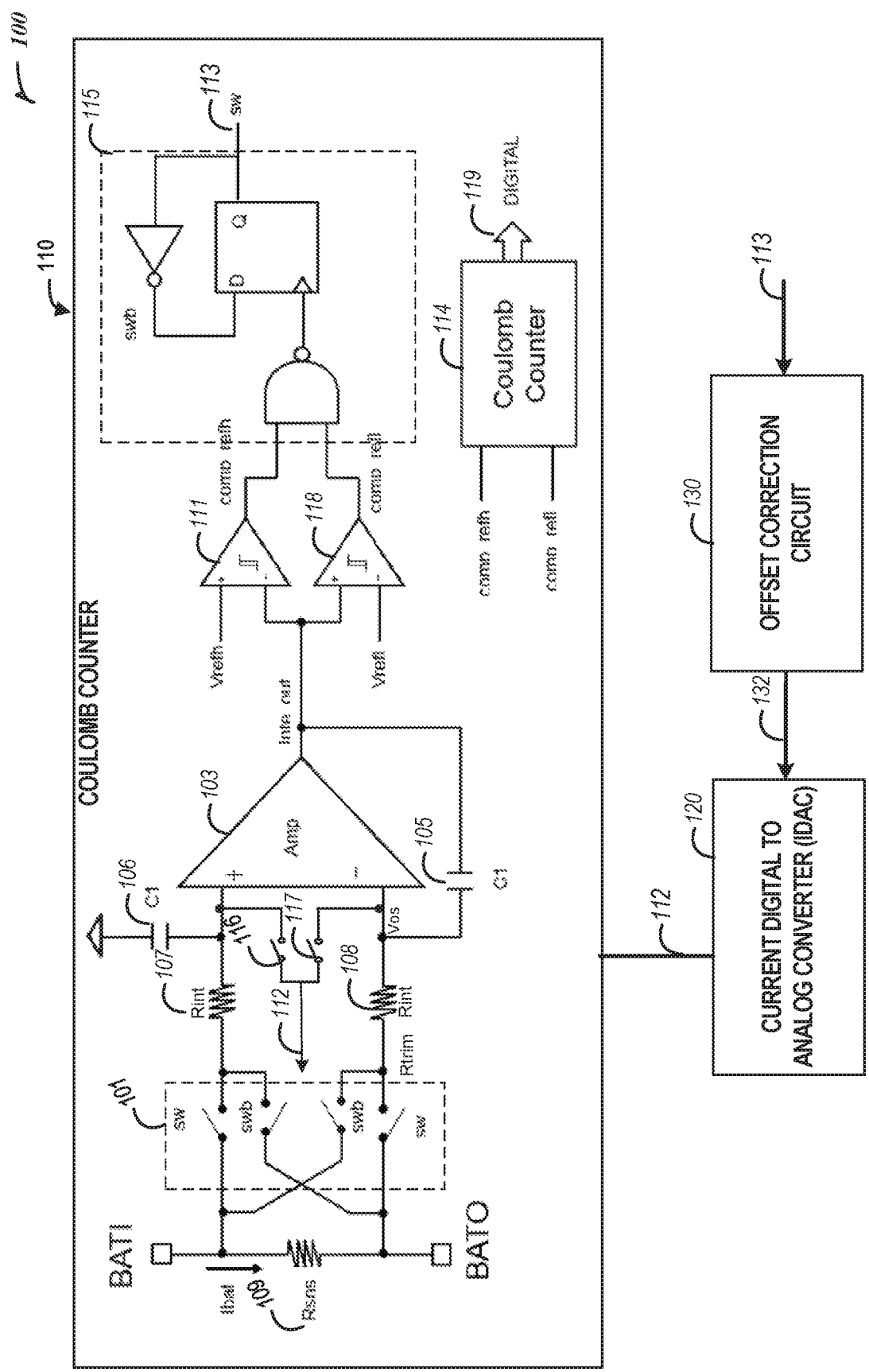
FIG. 1 is a block diagram of an example of a coulomb counter with offset calibration system in accordance with various embodiments.

This disclosure describes, among other things, techniques for calibrating offset of a charge counter, such as a coulomb counter. Specifically, the disclosed techniques can vary the amount of current that a current digital-to-analog converter (IDAC) applies to an input of an integrator of the coulomb counter, such as based on a switching frequency (duty cycle) of the coulomb counter switch signal. For example, when the duty cycle is greater than 50 percent, the IDAC decreases the amount of current by a specified value, and when the duty cycle is less than 50 percent, the IDAC increases the amount of current by the specified value.

Coulomb counters can include various components, such as resistors, an integrator (including an amplifier), comparators, and counters. Such counters can operate by measuring a current value at the output of the integrator to control which input signals are coupled to the integrator. The integrator in the coulomb counter typically exhibits some amount of offset or ripple that tends to affect the accuracy of the count signals generated by the coulomb counter. This offset presents itself in a feedback voltage from the output of the integrator to the input of the integrator. While such an offset can normally be negligible, under certain low current conditions at the coulomb counter input, the offset can introduce errors (e.g., in the range of 4%) in the generated count signals.

One way to reduce the impact of the integrator offset is to introduce a compensation voltage using a compensation current delivered through a resistor (e.g., a trim resistor) to one of the inputs of the integrator. The amount of the compensation current that is provided is set to a specified value based on the measure of offset at the time the coulomb counter is manufactured. While this approach may work well in some cases, because the amount of compensation current is set to a predetermined value, such an approach fails to account for offsets in the integrator that result from temperature changes or other dynamic factors during operation of the coulomb counter.

To address the shortcomings of such approaches, the disclosed techniques can monitor the offset of the integrator of the coulomb counter continuously, recurrently, or intermittently during operation of the coulomb counter and adjust the amount of compensation current being applied to the integrator inputs based on the monitored offset. In this way, as the offset fluctuates with operating conditions, such as temperature changes, the compensation current is adjusted to account for the offset fluctuation. In an embodiment, the offset of the integrator is determined by analyzing a duty cycle of the coulomb counter switch signals that are generated based on the integrator output (e.g., by evaluating whether the switch signals are high for the same amount of time as they are low). When the duty cycle is greater than a specified amount (e.g., more than 50%), the amount of compensation current is reduced, and when the duty cycle is less than a specified amount (e.g., less than 50%), the amount of compensation current is increased.

FIG. 1 is a block diagram of an example of a charge counter or a coulomb counter with offset calibration system 100 in accordance with various embodiments. The coulomb counter with offset calibration system 100 includes a coulomb counter 110, a current digital to analog converter (IDAC) 120 and an offset correction circuit 130.

As illustrated in FIG. 1, the differential signal from one of the sense resistances, such as the sense resistor 109, may be delivered through a switching network 101 to an analog integrator 103, which may include an operational amplifier, capacitances 105 and 106, and input resistors 107 and 108. The output voltage Inte_out of the integrator 103 may be delivered to comparators 111 and 118, which may be configured to compare the output voltage Inte_out to a high reference voltage Vrefh and a low reference voltage Vrefl, respectively.

A control logic and polarity detection circuit 115 may be configured to detect the output states of the comparators 111 and 118. Each time these output states indicate that the output voltage Inte_out of the integrator 103 has reached the high reference voltage or the low reference voltage, the control logic and polarity detection circuit 115 may cause the switching network 101 to switch states using switch signals SW 113 and SWB, so as to reverse the polarity of the connection between the differential input and the integrator 103. Polarity of the differential input voltage may be detected by evaluating the state of the switching network 101 and which of the comparators 111 and 118 has tripped. If the same comparator trips twice in a row, this may indicate that polarity of the input signal has been reversed.

An accumulated charge register circuit 114 (e.g., a coulomb counter or charge counter) may be configured to maintain a count of each time the switching network 101 changes state. The accumulated charge register circuit 114 may be configured to increment the count when the polarity detection circuit 115 detects positive polarity and the output voltage Inte_out of the integrator 103 goes from the high reference voltage to the low reference voltage or vice versa. For example, the accumulated charge register circuit 114 may increment the count when the output voltage Inte_out of the integrator 103 exceeds the high reference voltage Vrefh. Similarly, the accumulated charge register circuit 114 may be configured to decrement the count when the polarity detection circuit detects negative polarity and the output voltage Inte_out of the integrator 103 goes from the high reference voltage to the low reference voltage or vice versa. For example, the accumulated charge register circuit 114 may decrement the count when the output voltage Inte_out of the integrator 103 falls below the low reference voltage Vrefl. If the same comparator trips twice in a row, this may indicate that the polarity of the input signal has been reversed and the accumulated charge register circuit 114 is neither incremented or decremented. A digital output 119 of the accumulated charge register circuit 114 may thus be indicative of the amount of charge which has flowed through the resistance which is associated with the integrator 103 illustrated in FIG. 1. Further details of aspects of the operation of the coulomb counter 110 are discussed in Schwoerer U.S. Pat. No. 8,233,582, issued Jul. 31, 2012, which is hereby incorporated by reference.

In certain circumstances, offset of the integrator 103 may introduce errors and delays in the output states of comparators 111 and 118 and the resulting digital output 119 provided by the accumulated charge register circuit 114. For example, without considering offset of the integrator 103, the integration time during rising and falling edges of the integrator 103 output may be represented by the following respective equations:

$$Trise = \frac{Vref * C1 * Rint}{Ibat * Rsns}$$

$$Tfall = \frac{Vref * C1 * Rint}{Ibat * Rsns}$$

Adding the amplifier offset voltage Vos, which presents itself as the feedback voltage from the output of the amplifier to the input of the amplifier through capacitor 105, to the above integration times results in the integration time of the integrator 103 being increased or decreased during a rising edge of the output voltage Inte_out of the integrator 103 in accordance with the following:

$$Trise' = \frac{Vref * C1 * Rint}{Ibat * Rsns + Vos}$$

and the integration time of the integrator 103 being increased or decreased during a falling edge of the output voltage Inte_out of the integrator 103 in accordance with the following:

$$Tfall' = \frac{Vref * C1 * Rint}{Ibat * Rsns - Vos}$$

Accordingly, the total integration time of the integrator 103 including the offset voltage Vos may be represented by:

$$T' = Trise' + Tfall'$$

$$T' = \frac{Vref * C1 * Rint}{Ibat * Rsns + Vos} + \frac{Vref * C1 * Rint}{Ibat * Rsns - Vos} = \frac{T}{1 - \left(\frac{Vos}{Ibat * Rsns}\right)2}$$

If the offset voltage Vos is different for the rising edge than the falling edge of the output voltage Inte_out of the integrator 103, the resulting switch signals SW 113 and SWB may have a duty cycle that is less than or greater than 50 percent. This is because the switch signal SW 113 may be low for one duration of time during the rising edge integration time and may be high for a different, second duration of time during the falling edge integration time.

To offset the offset voltage Vos of the integrator 103, respective trim resistors can be added in series with input resistors 107 and 108, and an offset current 112 may be added to one of the inputs of the integrator 103 using a current digital-to-analog converter (IDAC) 120. In some implementations, a first terminal of the trim resistor can be coupled in series to a terminal of input resistor 107/108 at a particular node and a second terminal of the trim resistor can be coupled to one of the inputs of the integrator 103 (e.g., the positive input in case the trim resistor is coupled to input resistor 107 or the negative input in case the trim resistor is coupled to the input resistor 108). In such cases, the current 112 is added to the particular node between the trim resistor and the input resistor 107/108. In some embodiments, the respective trim resistors are included as part of input resistors 107 and 108.

IDAC 120 may be a device that receives a digital signal and generates a current having a value corresponding to the digital signal (e.g., higher value digital signals at the input result in higher value currents at the output). Particularly, the offset current combined with the values of the trim resistors adds or subtracts a voltage to the offset voltage Vos of the integrator 103 to change the total integration time and ensure that the duty cycle of the switch signal 113 is 50 percent (e.g., is high for an equal amount of time as it is low).

The value of the current provided by the MAC 120 is determined by an offset correction circuit 130 that measures the duty cycle of the switch signal 113. For example, if the offset correction circuit 130 determines that the switch signal 113 is high (or is asserted) for a longer duration of time than it is low (or is de-asserted), the offset correction circuit 130 generates a digital signal 132 (by incrementing a previous value of the digital signal 132) to instruct the IDAC 120 to increase the compensation current 112 by a specified amount. Similarly, if the offset correction circuit 130 determines that the switch signal 113 is high (or is asserted) for a shorter duration of time than it is low (or is de-asserted), the offset correction circuit 130 generates a digital signal 132 (by decrementing a previous value of the digital signal 132) to instruct the IDAC 120 to decrease the compensation current 112 by the specified amount.

Initially, during startup, pside_en switch 116 and nside_en switch 117 are controlled to determine to which input of the amplifier the offset current will be applied. Namely, the pside_en switch 116 and nside_en switch 117 are controlled based on a polarity of the offset voltage Vos of the integrator 103. To control startup pside_en switch 116 and nside_en switch 117, at startup, a switch that couples first and second inputs of the integrator 103 is activated. Namely, the switch shorts the integrator 103 input. The output voltage Inte_out of the integrator 103 is analyzed to determine whether the output is high or low. If the output voltage Inte_out of the integrator 103 is high, the positive input of the integrator 103 is higher than the negative input. In such circumstances, the pside_en switch 116 is opened and the nside_en switch 117 is closed to cause the offset current 112 to be delivered to the negative input of the integrator 103 and thereby increase the voltage at the negative input. If the output voltage Inte_out of the integrator 103 is low, the negative input of the integrator 103 is higher than the positive input. In such circumstances, the pside_en switch 116 is closed and the nside_en switch 117 is opened to cause the offset current 112 to be delivered to the positive input of the integrator 103 and thereby increase the voltage at the positive input.

Figure 2:
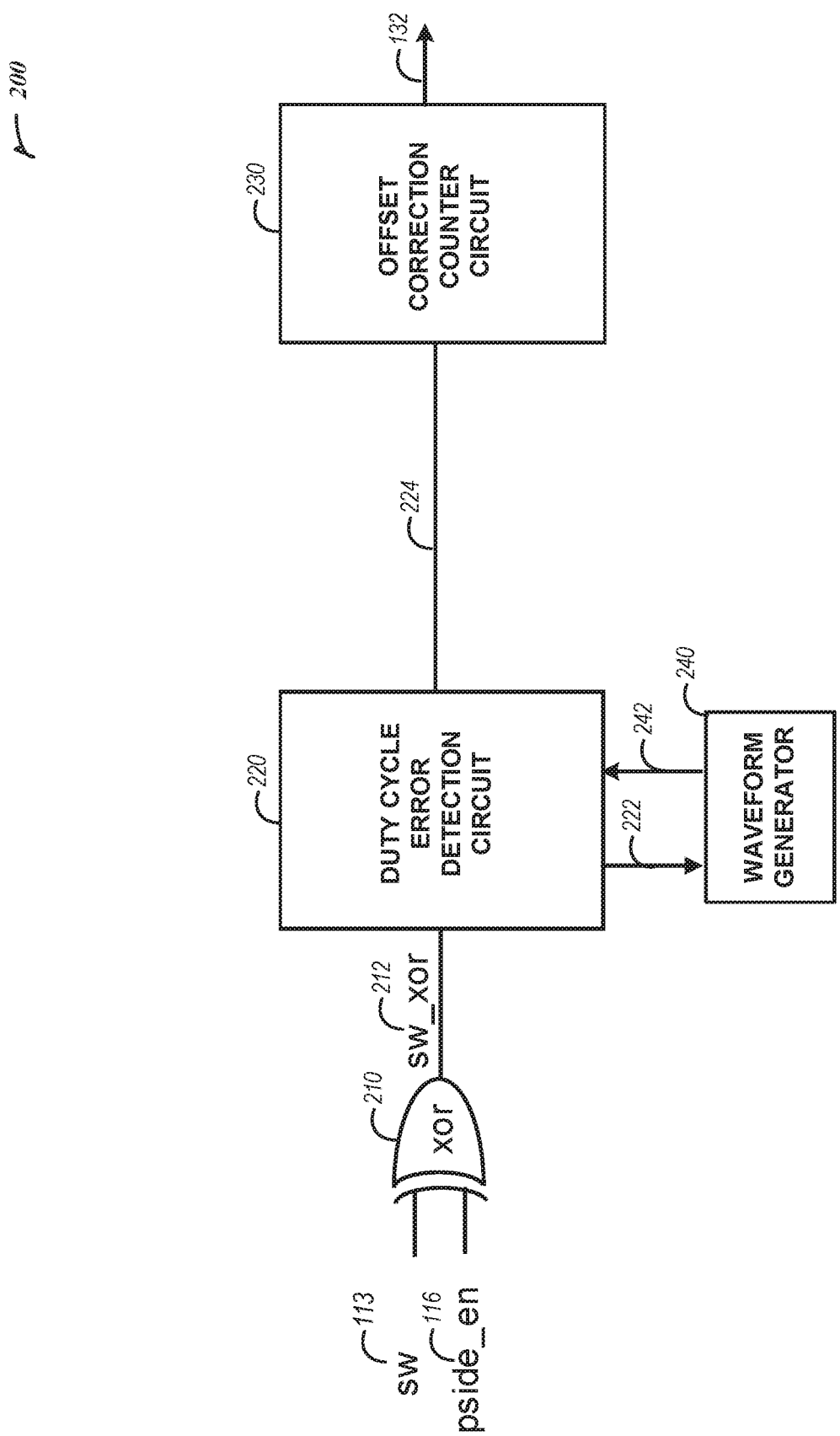
FIG. 2 is a block diagram of an example of an offset correction circuit in accordance with various embodiments.

FIG. 2 is a block diagram of an example of the offset correction circuit 130 in accordance with various embodiments. Offset correction circuit 130 includes a logic element 210, a duty cycle error detection circuit 220, a waveform generator 240, and an offset correction counter circuit 230.

Offset correction circuit 130 monitors the switch signal 113 to determine whether the switch signal 113 is high for more or less time than it is low (e.g., to determine the duty cycle of switch signal 113). Offset correction circuit 130 increments a count stored by offset correction counter circuit 230 when the duty cycle is determined to be greater than 50 percent (e.g., when the switch signal 113 is high for a longer time than it is low). Offset correction circuit 130 decrements a count stored by offset correction counter circuit 230 when the duty cycle is determined to be lower than 50 percent (e.g., when the switch signal 113 is high for a shorter time than it is low).

In order to determine whether the duty cycle of the switch signal 113 is greater than or less than 50 percent, the duty cycle error detection circuit 220 uses a waveform 242 provided by the waveform generator 240 to count the amount of time the switch signal 113 is higher relative to the amount of time the switch signal 113 is low. For example, duty cycle error detection circuit 220 includes an up/down counter and the waveform generator 240 generates a sawtooth waveform (though any other type of waveform can be used). The up/down counter includes an up mode in which a stored count value is incremented by one when the counter is triggered and a down mode in which the stored count value is decremented by one when the counter is triggered.

The up/down counter of the duty cycle error detection circuit 220 records the number of saw-tooth cycles during a given portion of the switch signal 113. The logic element 210 may be an XOR gate that receives at the inputs the switch signal 113 and the pside_en switch 116 signal indicating that the pside_en switch 117 is de-asserted meaning that the offset current is applied to the negative input of integrator 103. The pside_en switch 116 signal may be replaced with the nside_en switch 117 signal in cases where the offset current is provided to the positive input of the integrator 103. The output 212 of the logic element 210 indicates when the switch signal 113 transitions from low to high and from high to low states (e.g., the output 212 indicates the rising edge of switch signal 113 and the falling edge of switch signal 113). Particularly, when the switch signal 113 transitions from a low state to a high state, the output 212 also transitions from the low state to the high state. Similarly, when the switch signal 113 transitions from a high state to a low state, the output 212 also transitions from the high state to the low state. Duty cycle error detection circuit 220 may include circuitry suitable to detect the rising and falling edge of the output 212.

In some embodiments, the logic element 210 is omitted. In such cases, the switch signal 113 is coupled directly to the input of the duty cycle error detection circuit 220.

At the rising edge of the switch signal 113 (e.g., during a first portion of a cycle of the switch signal 113) and the rising edge of output 212, the up/down counter of the duty cycle error detection circuit 220 is cleared and set to the up mode. After each saw-tooth period (or at the end of each period of the waveform 242), the up/down counter of the duty cycle error detection circuit 220 is incremented by one.

At the falling edge of the switch signal 113 (e.g., during a second portion of the cycle of the switch signal 113 that is adjacent to the first portion) and the falling edge of output 212, the up/down counter is set to the down mode to start counting down the currently stored value. The duty cycle error detection circuit 220 also, at the falling edge of the switch signal 113, generates a swap signal 222 to change the direction of the waveform 242. In some embodiments, to change the direction of waveform 242 a multiplexor is used where the waveform 242 is the output of the multiplexor. One input of the multiplexor receives the saw-tooth waveform and a second input of the multiplexor receives an inverter version of the saw-tooth waveform. The swap signal 222 controls the multiplexor to output as waveform 242 the saw-tooth waveform or the inverted version of the saw-tooth waveform.

After each saw-tooth period of the inverted saw-tooth waveform 242 (or at the end of each period of the waveform 242), the up/down counter of the duty cycle error detection circuit 220 is decremented by one. At the end of each cycle of the switch signal 113 (e.g., after the switch signal 113 has been high followed by being low), the output of the up/down counter of the duty cycle error detection circuit 220 is analyzed to determine whether the stored count is greater than or less than 0. If the output of the up/down counter of the duty cycle error detection circuit 220 is greater than 0, the duty cycle error detection circuit 220 outputs a signal 224 to offset correction counter circuit 230 indicating that the duty cycle of the switch signal 113 is greater than 50 percent, lithe output of the up/down counter of the duty cycle error detection circuit 220 is less than 0, the duty cycle error detection circuit 220 outputs the signal 224 to offset correction counter circuit 230 indicating that the duty cycle of the switch signal 113 is less than 50 percent.

A count stored by offset correction counter circuit 230 is then incremented when the signal 224 indicates that the duty cycle is greater than 50 percent. The count stored by offset correction counter circuit 230 is decremented when the signal 224 indicates the duty cycle is lower than 50 percent (e.g., when the switch signal 113 is high for a shorter time than it is low). The count value stored by the offset correction counter circuit 230 is output as digital signal 132 to control the amount of current the DAC 120 provides to the positive or negative input of integrator 103.

Figure 3:
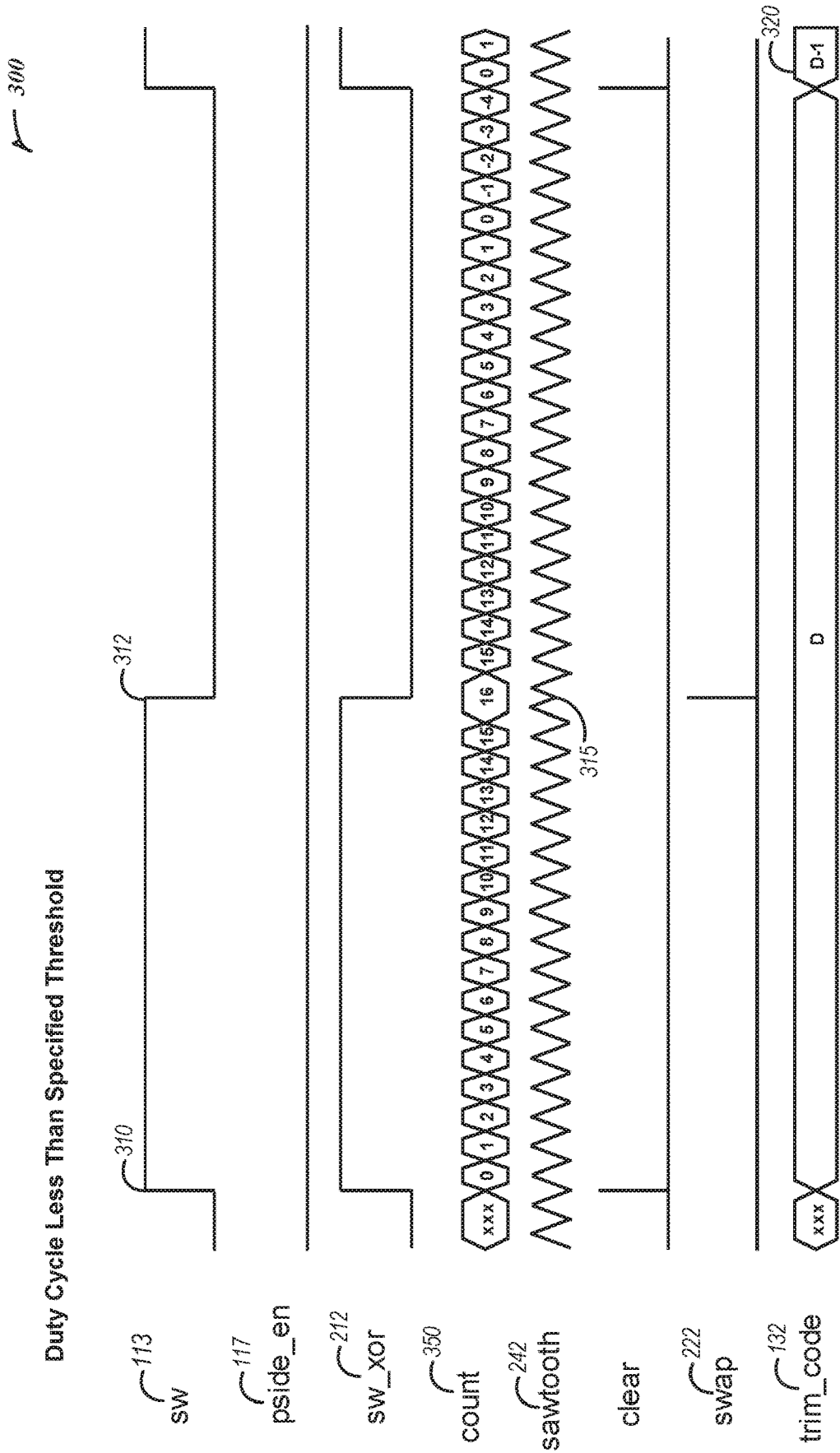
FIGS. 3-4 are timing diagrams of example operations of an offset correction circuit in accordance with various embodiments.

FIG. 3 is a timing diagram 300 of example operations of the offset correction circuit 130 when the duty cycle of the switch signal 113 is less than 50 percent in accordance with various embodiments. As shown in diagram 300, at the rising edge 310 of switch signal and while pside_en switch 117 signal is low (opening pside_en switch 117), the output 212 of logic element 210 transitions to the high state. At this point, the count 350 maintained by the up/down counter of the duty cycle error detection circuit 220 is incremented at the end of each period of the waveform 242. In response to detecting a falling edge 312 of the switch signal 113 and of the output 212, the waveform 242 is inverted 315 using swap signal 222. Also, the up/down counter of the duty cycle error detection circuit 220 is changed to the down mode. The count 350 maintained by up/down counter of the duty cycle error detection circuit 220 is decremented at the end of each period of the inverted waveform 242. At the end of the cycle of the switch signal 113 (e.g., when a subsequent rising edge is detected in the switch signal 113 and output 212), the current count 350 is analyzed to determine if it is greater than or less than a specified threshold (e.g., 0). In this case, the count 350 is determined to be −4, which is less than the specified threshold value of 0, and accordingly the digital signal 132 output by the offset correction counter circuit 230 is decremented 320 to reduce the offset current 112.

Figure 4:
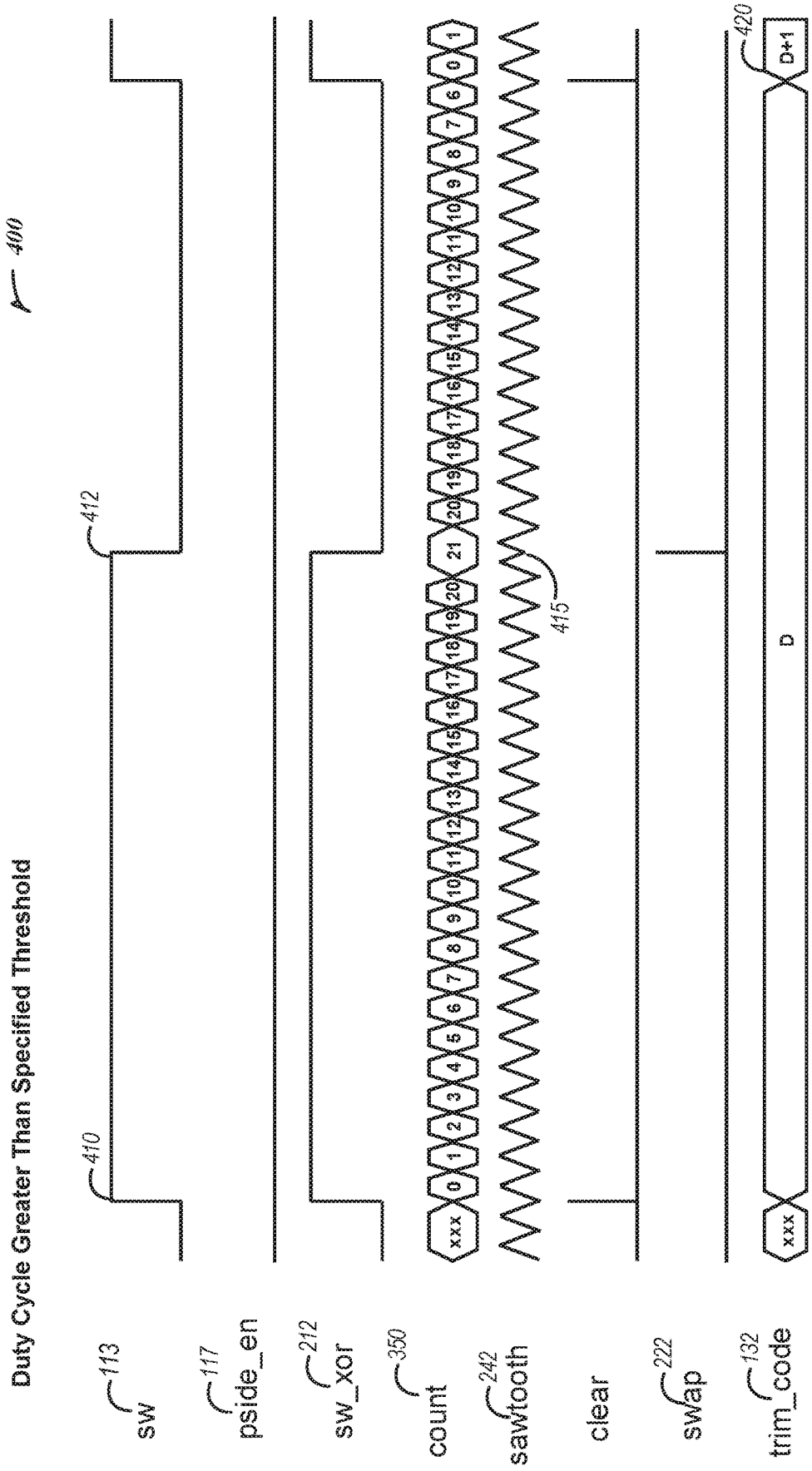

FIG. 4 is timing diagram 400 of example operations of the offset correction circuit 130 when the duty cycle of the switch signal 113 is greater than 50 percent in accordance with various embodiments. As shown in diagram 400, at the rising edge 410 of switch signal and while pside_en switch 117 signal is low (opening pside_en switch 117), the output 212 of logic element 210 transitions to the high state. At this point, the count 350 maintained by up/down counter of the duty cycle error detection circuit 220 is incremented at the end of each period of the waveform 242. In response to detecting a falling edge 412 of the switch signal 113 and of the output 212, the waveform 242 is inverted 415 using swap signal 222. Also, the up/down counter of the duty cycle error detection circuit 220 is changed to the down mode. The count 350 maintained by the up/down counter of the duty cycle error detection circuit 220 is decremented at the end of each period of the inverted waveform 242. At the end of the cycle of the switch signal 113 (e.g., when a subsequent rising edge is detected in the switch signal 113 and output 212), the current count 350 is analyzed to determine if it is greater than or less than a specified threshold (e.g., 0). In this case, the count 350 is determined to be 6, which is greater than the specified threshold value of 0, and accordingly the digital signal 132 output by the offset correction counter circuit 230 is incremented 420 to increase the offset current 112.

Figure 5:
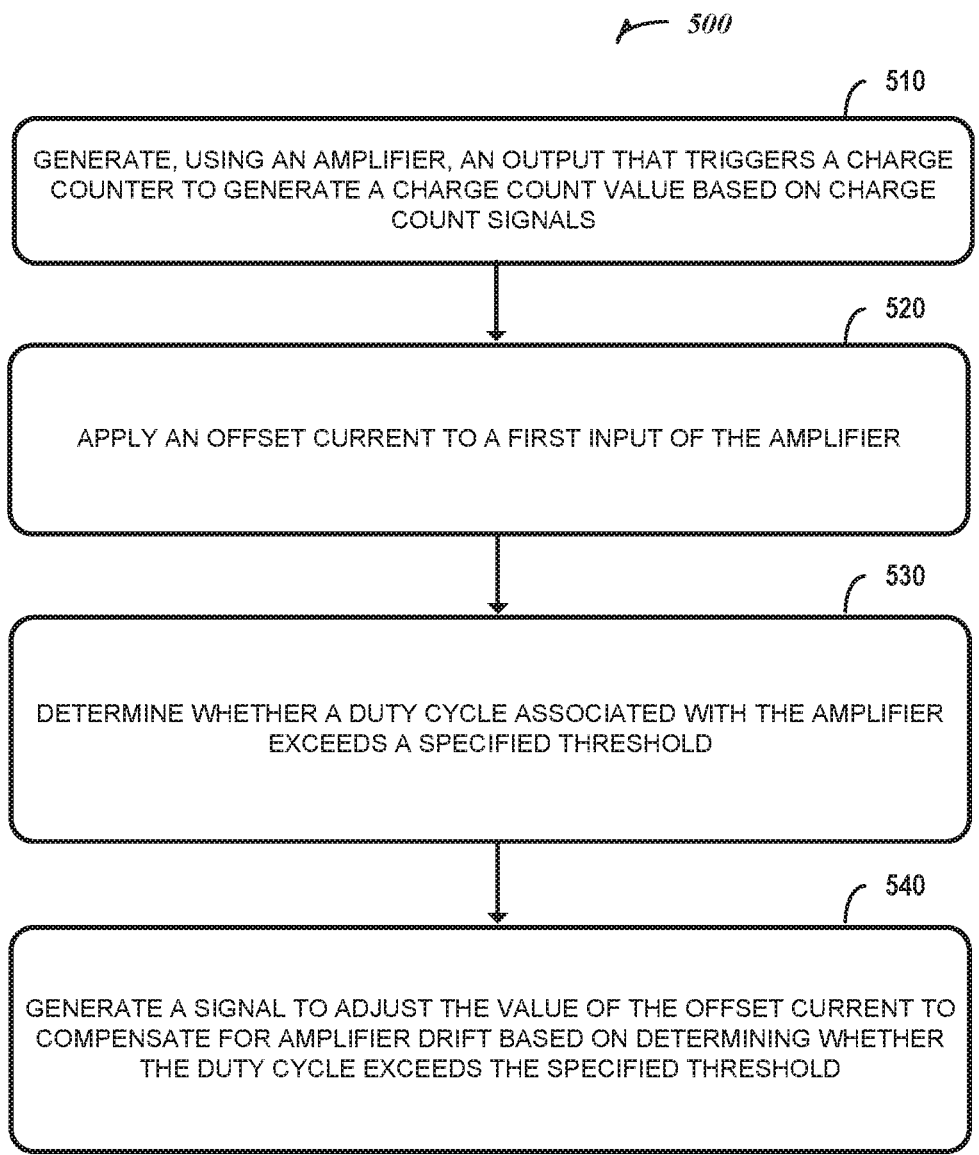
FIG. 5 is a flow diagram depicting example processes for applying offset calibration to a charge counter in accordance with various embodiments.

FIG. 5 is a flow diagram depicting example processes 500 for applying offset calibration to a charge counter in accordance with various embodiments.

At operation 510, coulomb counter 110 generates, using an amplifier, an output that triggers a charge counter to generate a charge count value based on charge count signals. For example, the accumulated charge register circuit 114 is triggered to generate a charge count digital signal 119 based on charge count signals output by comparators 111 and 113 which are based on the output of the integrator 103.

At operation 520, DAC 120 applies an offset current to a first input of the amplifier. For example, the nside_en switch 117 is closed to provide the offset current 112 to the negative input of the integrator 103 to offset the offset voltage Vos.

At operation 530, offset correction circuit 130 determines whether a duty cycle associated with the amplifier exceeds a specified threshold. For example, the offset correction circuit 130 analyzes the switch signal 113 to determine whether the switch signal 113, during a given cycle, is high for a longer or shorter amount of time than it is low, indicating that its duty cycle is greater than or less than 50 percent.

At operation 540, offset correction circuit 130 generates a signal to adjust the value of the offset current to compensate for amplifier drift based on determining whether the duty cycle exceeds the specified threshold. For example, the offset correction circuit 130 generates a digital signal 132 that is incremented relative to its previous value (thereby increasing the amount of offset current provided by IDAC 120) when the offset correction circuit 130 determines that the duty cycle of the switch signal 113 is greater than 50 percent (e.g., the switch signal 113 is high for a longer period of time than it is low in a given cycle). For example, the offset correction circuit 130 generates a digital signal 132 that is decremented relative to its previous value (thereby decreasing the amount of offset current provided by IDAC 120) when the offset correction circuit 130 determines that the duty cycle of the switch signal 113 is less than 50 percent (e.g., the switch signal 113 is low for a longer period of time than it is high in a given cycle).

Figure 6:
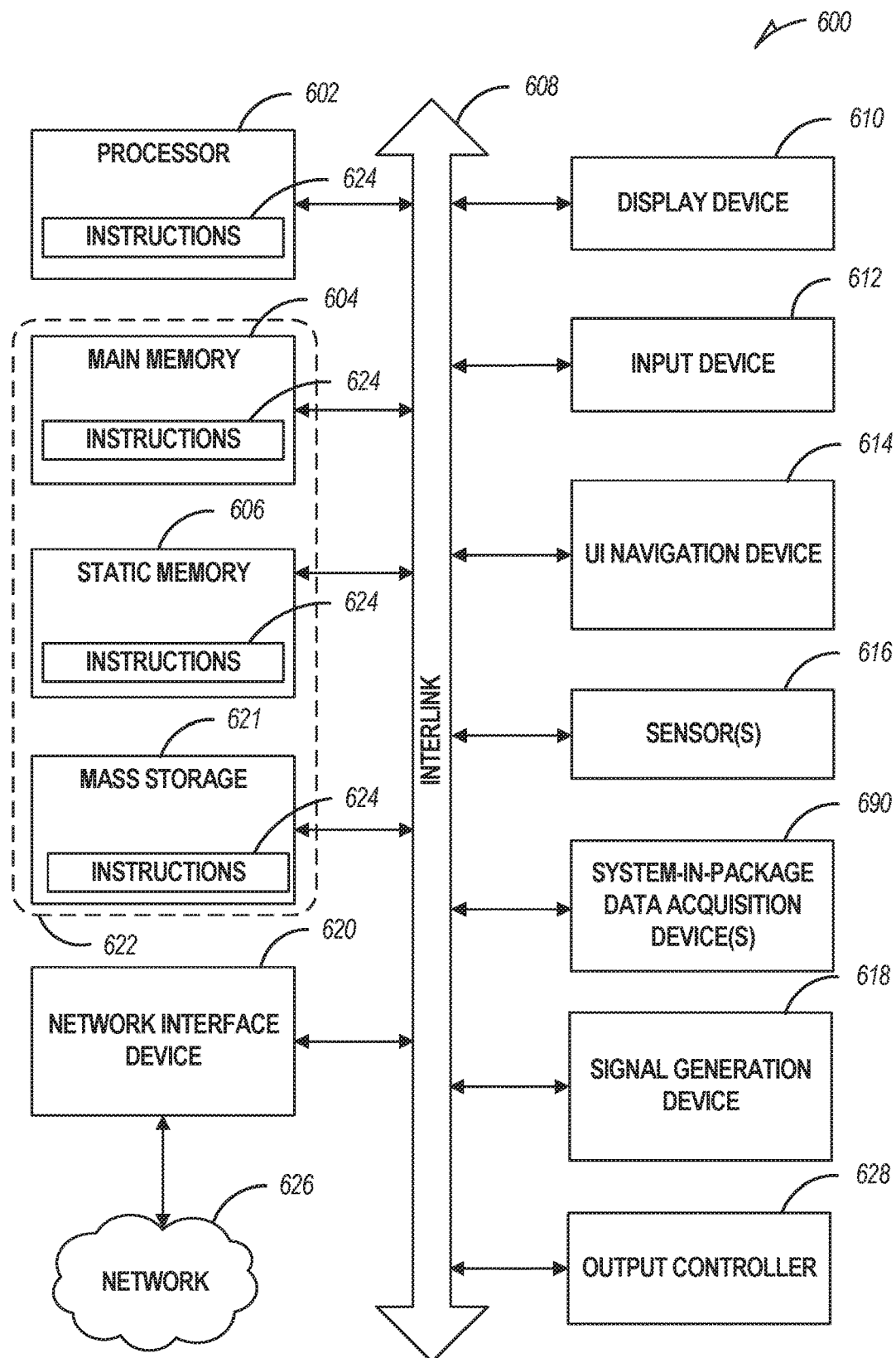
FIG. 6 is a block diagram illustrating an example of a machine upon which one or more embodiments may be implemented.

FIG. 6 is a block diagram of an example machine 600 upon which any one or more of the techniques (e.g., methodologies) discussed herein may be performed. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in a peer-to-peer (P2P) (or other distributed) network environment. The machine 600 may be a personal computer (PC), a tablet PC, a set-top box (STB), a personal digital assistant (PDA), a mobile telephone, a web appliance, an IoT device, an automotive system, an aerospace system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, by moveable placement of invariant-massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 600 may include a hardware processor 602 (e.g., a central processing unit (CPU), a graphics processing unit (GPU), a hardware processor core, or any combination thereof, such as a memory controller, etc.), a main memory 604, and a static memory 606, some or all of which may communicate with each other via an interlink (e.g., bus) 608. The machine 600 may further include a display device 610, an alphanumeric input device 612 (e.g., a keyboard), and a user interface (UI) navigation device 614 (e.g., a mouse). In an example, the display device 610, alphanumeric input device 612, and UI navigation device 614 may be a touchscreen display. The machine 600 may additionally include a storage device 622 (e.g., drive unit); a signal generation device 618 (e.g., a speaker); a network interface device 620; one or more sensors 616, such as a Global Positioning System (GPS) sensor, wing sensors, mechanical device sensors, temperature sensors, ICP sensors, bridge sensors, audio sensors, industrial sensors, a compass, an accelerometer, or other sensors; and one or more system-in-package data acquisition devices 690. The system-in-package data acquisition device(s) 690 may implement some or all of the functionality of the offset calibration system 100. The machine 600 may include an output controller 628, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The storage device 622 may include a machine-readable medium on which is stored one or more sets of data structures or instructions 624 (e.g., software) embodying or utilized by any one or more of the techniques or functions described herein. The instructions 624 may also reside, completely or at least partially, within the main memory 604, within the static memory 606, or within the hardware processor 602 during execution thereof by the machine 600. In an example, one or any combination of the hardware processor 602, the main memory 604, the static memory 606, or the storage device 621 may constitute the machine-readable medium.

While the machine-readable medium is illustrated as a single medium, the term "machine-readable medium" may include a single medium or multiple media (e.g., a centralized or distributed database, or associated caches and servers) configured to store the one or more instructions 624.

The term "machine-readable medium" may include any transitory or non-transitory medium that is capable of storing, encoding, or carrying transitory or non-transitory instructions for execution by the machine 600 and that cause the machine 600 to perform any one or more of the techniques of the present disclosure, or that is capable of storing, encoding, or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 (e.g., software, programs, an operating system (OS), etc.) or other data that are stored on the storage device 621 can be accessed by the main memory 604 for use by the hardware processor 602. The main memory 604 (e.g., DRAM) is typically fast, but volatile, and thus a different type of storage from the storage device 621 (e.g., an SSD), which is suitable for long-term storage, including while in an "off" condition. The instructions 624 or data in use by a user or the machine 600 are typically loaded in the main memory 604 for use by the hardware processor 602. When the main memory 604 is full, virtual space from the storage device 621 can be allocated to supplement the main memory 604; however, because the storage device 621 is typically slower than the main memory 604, and write speeds are typically at least twice as slow as read speeds, use of virtual memory can greatly reduce user experience due to storage device latency (in contrast to the main memory 604, e.g., DRAM). Further, use of the storage device 621 for virtual memory can greatly reduce the usable lifespan of the storage device 621.

The instructions 624 may further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone Service (POTS) networks, and wireless data networks (e.g., Institute of Electrical and Electronics Engineers (IEEE) 802.11 family of standards known as Wi-Fi®, IEEE 802.16 family of standards known as WiMax®, IEEE 802.15.4 family of standards, peer-to-peer (P2P) networks), among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible or intangible medium that is capable of storing, encoding, or carrying instructions for execution by the machine 600, and includes digital or analog communications signals or other tangible or intangible media to facilitate communication of such software.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the inventive subject matter may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended; that is, a system, device, article, composition, formulation, or process that includes elements in addition to those listed after such a term in a claim are still deemed to fall within the scope of that claim. Moreover, in the following claims, the terms "first," "second," "third," etc., are used merely as labels, and are not intended to impose numerical requirements on their objects.

Method examples described herein may be machine- or computer-implemented at least in part. Some examples may include a computer-readable medium or machine-readable medium encoded with transitory or non-transitory instructions operable to configure an electronic device to perform methods as described in the above examples. An implementation of such methods may include code, such as microcode, assembly-language code, a higher-level-language code, or the like. Such code may include transitory or non-transitory computer-readable instructions for performing various methods. The code may form portions of computer program products. Further, in an example, the code may be tangibly stored on one or more volatile, non-transitory, or non-volatile tangible computer-readable readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read-only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above detailed description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the detailed description as examples or embodiments, with each claim standing on its own as a separate embodiment, and it is contemplated that such embodiments may be combined with each other in various combinations or permutations. The scope of the inventive subject matter should be determined with reference to the appended claims, along with the full scope of equivalents to which such claims are entitled.

What is claimed is:

1. A system for compensating for amplifier drift, the system comprising:
    an amplifier configured to generate an output that triggers a charge counter to generate a charge count value based on a charge count signal, wherein the charge count signal generates a switch signal that swaps a first input of the amplifier with a second input of the amplifier when a voltage at the output of the amplifier exceeds a reference voltage value;
    a current digital-to-analog converter (IDAC) coupled to the amplifier and configured to provide an offset current to the first input of the amplifier; and
    an offset correction circuit configured to:
        determine whether a duty cycle associated with the amplifier exceeds a specified threshold; and
        generate a signal to cause the IDAC to adjust the value of the offset current to compensate for amplifier drift based on determining whether the duty cycle exceeds the specified threshold.

2. The system of claim 1, wherein the charge counter comprises a coulomb counter.

3. The system of claim 1, wherein the offset correction circuit is configured to determine whether the duty cycle associated with the amplifier exceeds the specified threshold by:
    counting a first number of periods of a given waveform during a first portion of a period of the switch signal;
    counting a second number of periods of the given waveform during a second portion of the period of the switch signal adjacent to the first portion; and
    determining whether the duty cycle associated with the amplifier exceeds the specified threshold based on a difference between the first and second numbers.

4. The system of claim 3, wherein the offset correction circuit is configured to determine that the duty cycle associated with the amplifier corresponds to the specified threshold when the first and second numbers are equal indicating the switch signal has a fifty percent duty cycle.

5. The system of claim 3, wherein the first portion of the period of the switch signal is measured from a rising edge of the switch signal to an adjacent falling edge of the switch signal, and wherein the second portion of the period of the switch signal is measured from the falling edge of the switch signal to an adjacent rising edge of the switch signal.

6. The system of claim 3, wherein when the first number is greater than the second number, the duty cycle is determined to be greater than the specified threshold, and when the first number is less than the second number, the duty cycle is determined to be less than the specified threshold.

7. The system of claim 6, wherein the offset correction circuit is configured to generate the signal by:
   incrementing a count value that is provided as the signal when the duty cycle is determined to be greater than the specified threshold; and
   decrementing the count value when the duty cycle is determined to be less than the specified threshold.

8. The system of claim 3, wherein the offset correction circuit is configured to count the first number of periods by:
   resetting a duty cycle counter at a beginning of the first portion; and
   incrementing the duty cycle counter at an end of each period of the waveform during the first portion.

9. The system of claim 8, wherein the offset correction circuit is configured to count the second number of periods by decrementing the duty cycle counter at an end of each period of the waveform during the second portion.

10. The system of claim 3, wherein the waveform is a saw-tooth waveform.

11. The system of claim 1, wherein the offset correction circuit is configured to determine whether the duty cycle associated with the amplifier exceeds the specified threshold at each period of the switch signal.

12. The system of claim 1, wherein the offset current compensates for amplifier drift resulting from temperature drift or supply drift.

13. A method for compensating for amplifier drift, the method comprising:
   generating, using an amplifier, an output that triggers a charge counter to generate a charge count value based on a charge count signal, wherein the charge count signal generates a switch signal that swaps a first input of the amplifier with a second input of the amplifier when a voltage at the output of the amplifier exceeds a reference voltage value;
   applying an offset current to the first input of the amplifier;
   determining whether a duty cycle associated with the amplifier exceeds a specified threshold; and
   generating a signal to adjust the value of the offset current to compensate for amplifier drift based on determining whether the duty cycle exceeds the specified threshold.

14. The method of claim 13, wherein the charge counter comprises a coulomb counter.

15. The method of claim 13 further comprising:
   counting a first number of periods of a given waveform during a first portion of a period of the switch signal;
   counting a second number of periods of the given waveform during a second portion of the period of the switch signal adjacent to the first portion; and
   determining whether the duty cycle associated with the amplifier exceeds the specified threshold based on a difference between the first and second numbers.

16. The method of claim 15, wherein the first portion of the period of the switch signal is measured from a rising edge of the switch signal to an adjacent falling edge of the switch signal, and wherein the second portion of the period of the switch signal is measured from the falling edge of the switch signal to an adjacent rising edge of the switch signal.

17. The method of claim 15, wherein when the first number is greater than the second number, the duty cycle is determined to be greater than the specified threshold, and when the first number is less than the second number, the duty cycle is determined to be less than the specified threshold.

18. An apparatus for compensating for amplifier drift, the apparatus comprising:
   means for generating, using an amplifier, an output that triggers a charge counter to generate a charge count value based on a charge count signal, wherein the charge count signal generates a switch signal that swaps a first input of the amplifier with a second input of the amplifier when a voltage at the output of the amplifier exceeds a reference voltage value;
   means for applying an offset current to a first input of the amplifier;
   means for determining whether a duty cycle associated with the amplifier exceeds a specified threshold; and
   means for generating a signal to adjust the value of the offset current to compensate for amplifier drift based on determining whether the duty cycle exceeds the specified threshold.

19. The apparatus of claim 18, wherein the charge counter comprises a coulomb counter.

20. The apparatus of claim 18 further comprising:
   means for counting a first number of periods of a given waveform during a first portion of a period of the switch signal;
   means for counting a second number of periods of the given waveform during a second portion of the period of the switch signal adjacent to the first portion; and
   means for determining whether the duty cycle associated with the amplifier exceeds the specified threshold based on a difference between the first and second numbers.

* * * * *

UNITED STATES PATENT AND TRADEMARK OFFICE
CERTIFICATE OF CORRECTION

PATENT NO. : 10,938,353 B2
APPLICATION NO. : 16/364930
DATED : March 2, 2021
INVENTOR(S) : Ni et al.

Page 1 of 1

It is certified that error appears in the above-identified patent and that said Letters Patent is hereby corrected as shown below:

On the Title Page

In item (57), in "Abstract", in Column 2, Line 10, delete "MAC" and insert --IDAC-- therefor Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*